United States Patent [19]
Lin et al.

[11] Patent Number: 5,847,818
[45] Date of Patent: Dec. 8, 1998

[54] CD VERNIER APPARATUS FOR SEM CD MEASUREMENT

[75] Inventors: Benjamin Szu-Min Lin, Chia-Yi; Nai-Lun Chang, Hsinchu, both of Taiwan

[73] Assignee: Winbond Electronics Corp., Hsinchu, Taiwan

[21] Appl. No.: 895,473

[22] Filed: Jul. 16, 1997

[51] Int. Cl.$^6$ .................................................. G01M 11/00
[52] U.S. Cl. ............................................................ 356/124.5
[58] Field of Search ................................ 356/124.5, 401

[56] References Cited

U.S. PATENT DOCUMENTS

| | | | |
|---|---|---|---|
| 4,343,877 | 8/1982 | Chiang | 430/5 |
| 4,442,188 | 4/1984 | Chiang | 430/5 |
| 4,863,548 | 9/1989 | Lee | 156/345 |

*Primary Examiner*—F. L. Evans
*Attorney, Agent, or Firm*—Ladas & Parry

[57] ABSTRACT

A critical dimension (CD) vernier apparatus, appropriate for scanning electron microscope (SEM) measurements, formed with additional encoding patterns. A central strip pattern is disposed along a specific direction. A first plurality of strip patterns is disposed in parallel along the specific direction and at a first side adjacent to the central strip pattern. A second plurality of strip patterns is disposed in parallel along the specific direction and at a second side adjacent to the central strip pattern. A plurality of recognition patterns is selectively added to the strip patterns whereby the central strip pattern, the recognition patterns, and the strip patterns at the first side and the second side form a specific figure to serve as a critical dimension vernier pattern. In addition, a novel critical dimension vernier, which is appropriate for measuring the compliance of contact hole dimensions to process parameters at a specific resolution is provided. The CD vernier includes a plurality of contact hole patterns disposed as an array, whereby said contact hole patterns in the first and last rows of the array and the contact hole patterns in the first and last columns of said array can be selectively varied with their dimensions such that all the contact hole patterns can form a specific pattern to serve as the critical dimension vernier.

9 Claims, 3 Drawing Sheets

CD VERNIER APPARATUS FOR SEM CD MEASUREMENT

BACKGROUND OF THE INVENTION

1. Field of the Invention

The present invention relates to critical dimension (CD) vernier designs and, in particular, to novel CD vernier designs for automatic scanning electron microscope (SEM) CD measurement.

2. Description of Related Art

Along with the development of semiconductor technology, the VLSI process has advanced toward the deep submicron field. Accordingly, the line width, line space, and the size of contact holes have all shrunk such that controlling the critical dimensions of the semiconductor devices is more difficult than ever. To make the fabrication process for VLSI stable and reliable, it is very important to keep the deviations of the critical dimensions within a tolerance range. In order to meet such requirements, the process parameters must be set up by practical CD vernier experiments. Therefore, CD verniers or CD bars are designed for SEM CD measurement to ensure that real pattern CD values are in the acceptable range of designed target CD values.

Referring to FIG. 1, a plurality of conventional CD verniers are formed on small area 10 of a substrate by using photolithography process. Each vernier includes a measured pattern and a recognition pattern. As depicted in FIG. 1, there are 6 sets of measured patterns A–F. Those patterns are measured with an SEM, either automatically or manually to check whether the line width, or the line space corresponds with the process requirements under different resolutions. The measured patterns of the conventional CD verniers have the same geometric shapes; they differ only in dimensions. Therefore, additional recognition patterns are required to distinguish the CD verniers. As depicted in FIG. 1, the recognition patterns A1–F1 which are numerals as usual are formed to indicate the measured patterns A–F respectively. Further, the recognition patterns A1–F1 and the measured patterns A–F are always separated by a long distance, in order to prevent the resolutions of the measured patterns being influenced by the recognition patterns due to light diffraction during photolithography process.

FIG. 2 illustrates an enlarged view of measured pattern A and its corresponding recognition pattern A1 in FIG. 1. In FIG. 2, the observation area of a SEM is enclosed by a dashed line and designated by numeral 20 and the line to be measured is designated by numeral 21. When the CD dimensions of the contact hole are to be measured then measured patterns A–F in FIG. 1 are replaced by the contact hole measured patterns. FIG. 3 illustrates conventional measured pattern 30 and its recognition pattern 31 for measuring the critical dimensions of a contact hole, wherein numeral 32 designates the observation area of a SEM.

To speed up the measurement process, it is necessary for the SEM to measure the CD verniers automatically. However, the geometric shapes of the CD verniers are the same, so it is very difficult for SEM to recognize the CD verniers automatically. Even though the CD verniers are indicated by recognition patterns, CD vernier recognition still may be faulty. The observation area of the SEM is not large enough to observe a whole CD vernier pattern, and the recognition patterns are located far away from the corresponding measured patterns. Therefore, the SEM must find a recognition pattern first such as A1 and then the lens of the SEM must be moved and aim at the corresponding measured pattern such as A to take measurements. Since the CD verniers are all disposed within a local area, CD verniers are located as close as possible to the adjacent one. Therefore, the deviations resulting from moving the lens of the SEM will increase the possibility of misrecognizing the measured pattern, for example misrecognizing B as A in FIG. 1. Further, if the critical dimensions of the CD verniers are varied due to process deviations, it is even difficult to lock on the right measured pattern with the recognition pattern automatically. In other words, when the SEM locks on a measured pattern for measuring and the measuring result exceeds the tolerance range, it is very difficult to determine whether the outcome results from misrecognition or deviation from process parameters.

SUMMARY OF THE INVENTION

In view of the problems mentioned above, an objective of the present invention is to provide novel CD vernier designs to reduce the probability of misrecognition due to extra motion of the SEM lens.

Another objective of the present invention is to provide novel CD vernier designs which are appropriate for automatic SEM CD measurement to improve the throughput.

To achieve the above objectives, a novel critical dimension vernier, which is appropriate for measuring the compliance of line dimensions to process parameters at specific resolutions is disclosed. The novel CD vernier includes a central strip pattern disposed along a specific direction. A first plurality of strip patterns is disposed in parallel along the specific direction and at a first side adjacent to the central strip pattern. A second plurality of strip patterns IS disposed in parallel, along the specific direction and at a second side adjacent to the central strip pattern. A plurality of recognition patterns is selectively added to the strip patterns, wherein the number of the strip patterns at the first side equals that of the strip patterns at the second side, and each of the strip patterns has an equal length which is shorter than the length of the central strip pattern but is longer than the length of the recognition patterns. One end of the central strip pattern, one end of each strip pattern on the first side and the second side are all aligned on a base line, whereby the central strip pattern, the recognition patterns, and the strip patterns at first side and second side form a specific figure to serve as a critical dimension vernier pattern.

Further, a novel critical dimension vernier, which is appropriate for measuring the compliance of contact hole dimensions to process parameters at a specific resolution is provided. The CD vernier includes a plurality of contact hole patterns disposed as an array, whereby said contact hole patterns in the first and last rows of the array and the contact hole patterns in the first and last columns of said array can be selectively varied with their dimensions such that all the contact hole patterns can form a specific pattern to serve as the critical dimension vernier.

DETAILED DESCRIPTION OF THE INVENTION

To make the objectives, features, and advantages more obvious and understandable, the present invention is described in detail as follows in accompaniment with the embodiments and drawings.

DETAILED DESCRIPTION OF THE INVENTION

First embodiment

Figure 1:
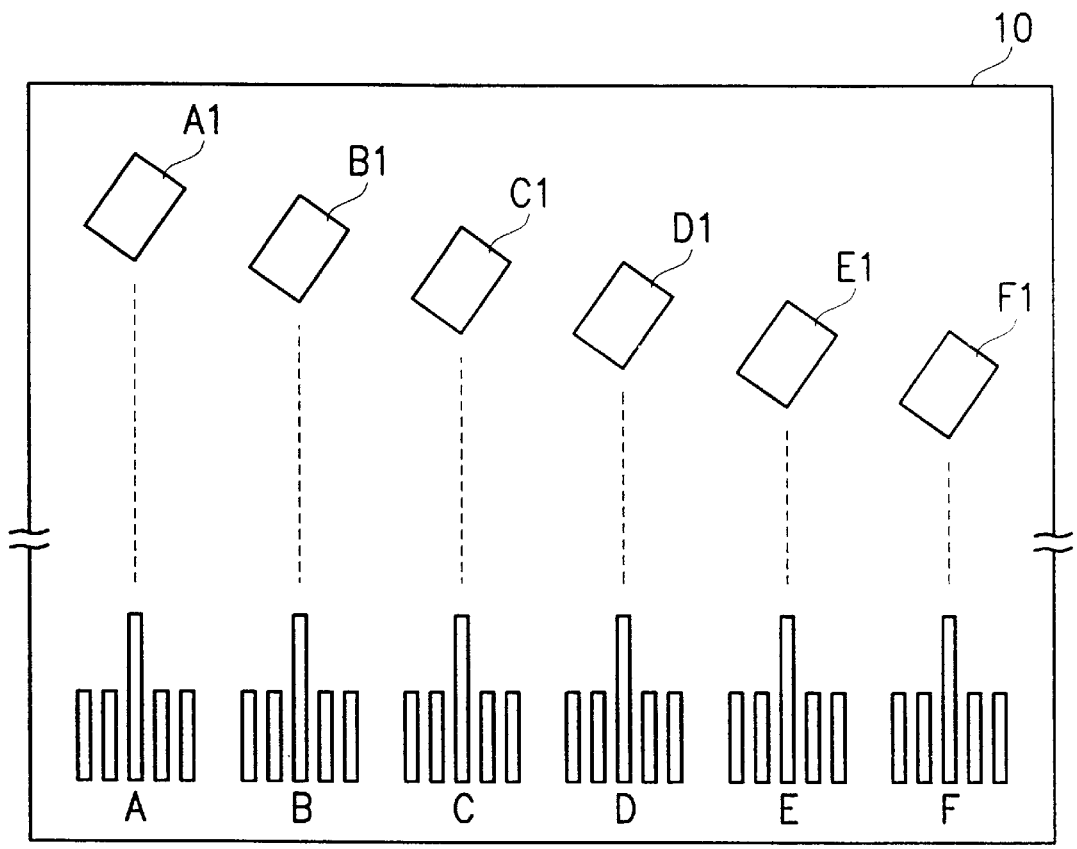
FIG. 1 illustrates the displacement of conventional CD verniers.
Figure 2:
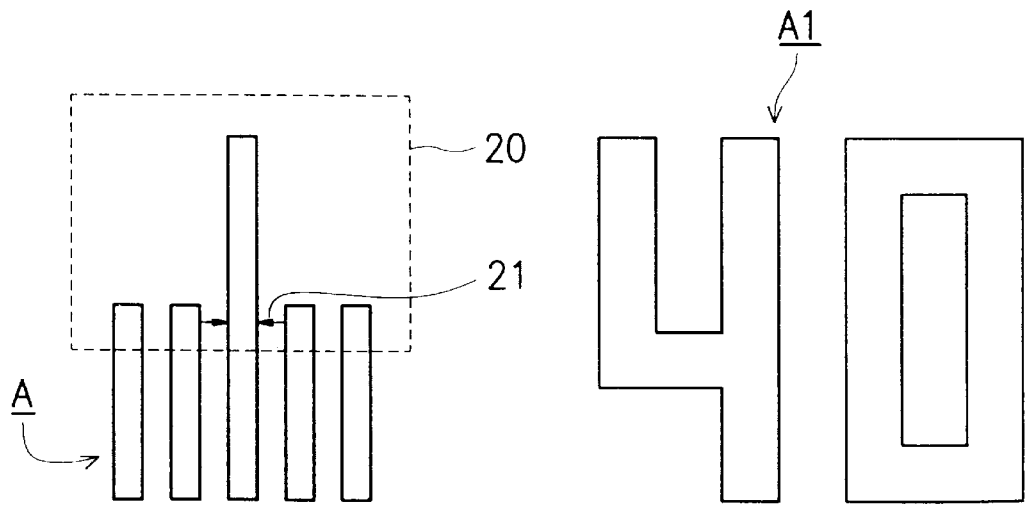
FIG. 2 illustrates an enlarged view of one set of CD verniers in FIG. 1.
Figure 3:
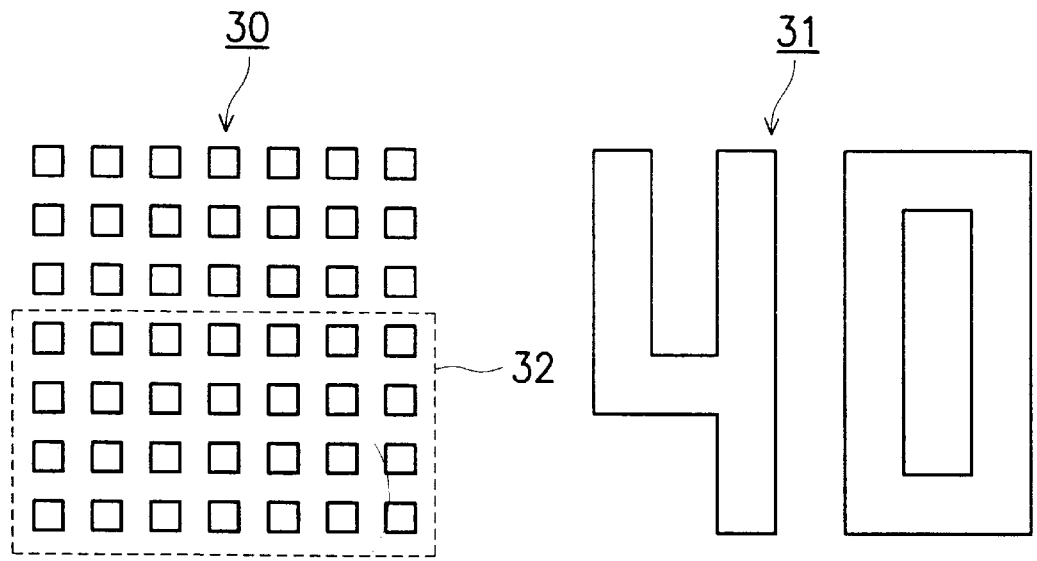
FIG. 3 illustrates a conventional CD vernier test pattern for measuring the compliance of contact hole dimensions with process parameters.
Figure 4:
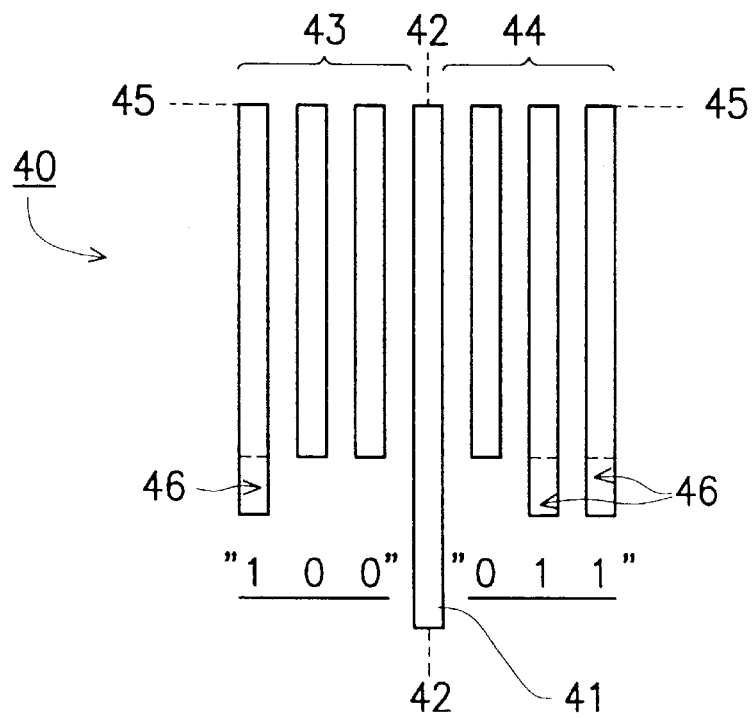
FIG. 4 illustrates an embodiment according to the present invention for measuring the compliance of line dimensions with process parameters.

FIG. 4 illustrates an embodiment according to the present invention for measuring the compliance of line dimensions with process parameters. Referring to FIG. 4, a CD vernier test pattern includes: central strip pattern 41 disposed along specific direction 42; a first plurality of strip patterns disposed in parallel, along said specific direction 42, and at first side 43 adjacent to said central strip pattern 41 (here, three strip patterns are disposed); and a second plurality of strip patterns disposed in parallel, along said specific direction 42, and at second side 44 adjacent to said central strip pattern 41, wherein a plurality of recognition patterns are added to selected ones of said strip patterns. The width of each recognition pattern is the same as those of the strip patterns and the length of each recognition pattern is 1.5~2 times of those of the strip patterns.

As depicted in FIG. 4, one end of each strip pattern on first side 43 and second side 44 are aligned on base line 45. Recognition patterns 46 are added to the other end of the selected strip pattern.

The recognition patterns 46 can serve as binary digits "1" and "0" respectively, according to whether or not a recognition pattern is added to a strip pattern. Therefore, the strip patterns at first side 43 and second side 44 can be encoded, from first side 43 toward second side 44, for example. As shown in FIG. 4, the binary codes corresponding to the strip patterns on first side 43 and second side 44 are "100" and "011" respectively and the two binary codes indicate numeral "43". The numeral "43" can be used to indicate the resolution of the line process, for example.

Thus it can be seen that the present invention does not require an additional mark pattern for recognition as does the prior art such that the lens of the SEM need not be further moved to target the test pattern. This reduces the possibility for misrecognition. In addition, the present invention is appropriate for automatic SEM measurement, because the set up CD vernier patterns can be first installed in the SEM such that the CD vernier test patterns can be easily recognized by the SEM.

Second embodiment

Figure 5:
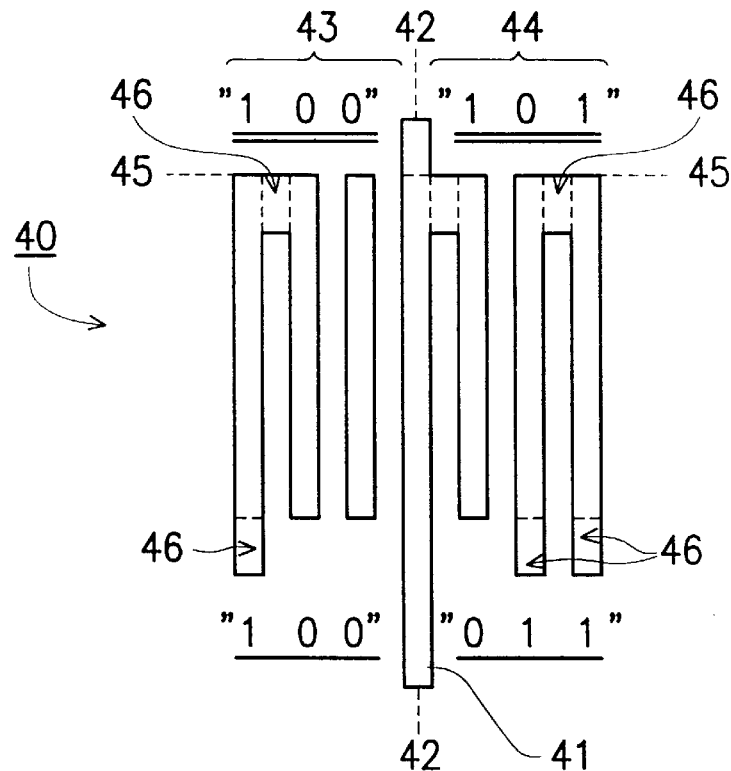
FIG. 5 illustrates another embodiment according to the present invention for measuring the compliance of line dimensions with process parameters.

In FIG. 4, recognition patterns 46 can selectively be added to the spaces of any two adjacent strip patterns close to base line 45, and the strip patterns at first side 43 and second side 44 are encoded respectively to represent binary notations, according to whether recognition pattern 46 is added to a space between two strip patterns. For example, if recognition pattern 46 is added to a space between two strip patterns close to base line 45, then a binary digit "1" is encoded, while if not, then a binary digit "0" is encoded. As depicted in FIG. 5, the ends of the strip patterns at first side 43 and second side 44 close to base line 45 are encoded as "100" and "101" respectively, and the two binary codes indicates a numeral "45". Numeral "45" can be used to indicate the line space resolution, for example. It should be noted that a recognition pattern has been added to one end of central strip pattern 41 close to base line 45 to distinguish clearly the first side and second side. Therefore, two versions of the same information of the line process are indicated in FIG. 5, by way of example.

Third embodiment

Figure 6:
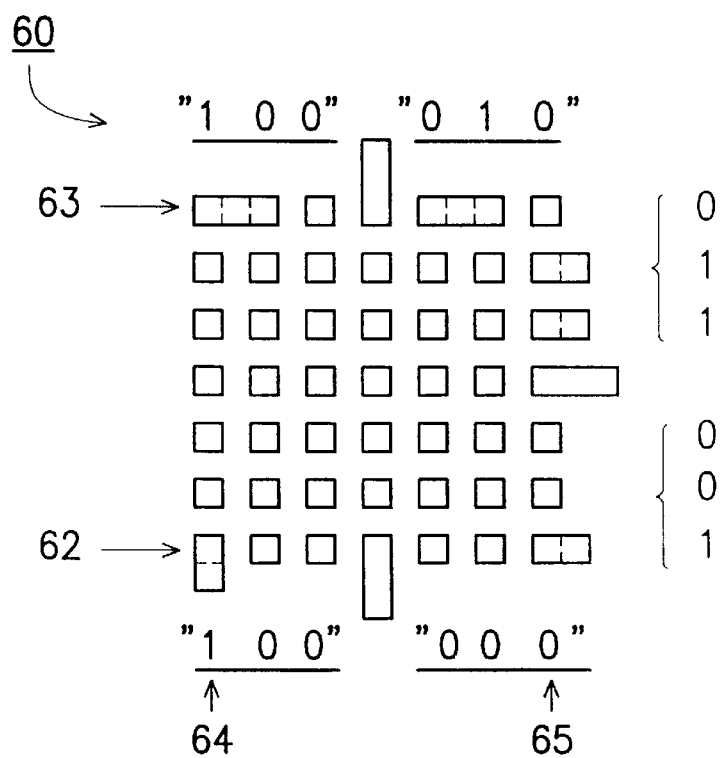
FIG. 6 illustrates a further embodiment according to the present invention for measuring the compliance of contact hole dimensions with process parameter.

FIG. 6 illustrates an embodiment according to the present invention for measuring the compliance of contact hole dimensions with process parameters, and the rows indicated by 62 and 63 are defined as the first and last rows respectively, and the columns indicated by 64 and 65 are defined as the first column and last column respectively. Referring to FIG. 6, CD vernier test pattern 60 includes: a plurality of contact hole patterns disposed as an array of 7 rows and 7 columns in this embodiment, whereby said contact hole patterns in first row 62 and last row 63 of the array and the contact hole patterns in first column 64 and last column 65 of the array can be selectively varied with their dimensions such that all the contact hole patterns can form a specific pattern as the critical dimension vernier.

In this embodiment, the patterns in first row 62 can be selectively stretched out of the array along the column direction of the array such that the patterns in first row 62 have two different lengths, thereby using the two different lengths as corresponding binary codes, "1" and "0", and the patterns in the first rows are encoded respectively to represent binary notations. The pattern at the intersection of the first row and the third column is stretched out of the array to serve as an encoding separation. Hence, referring to FIG. 6 again, the patterns in the first row are encoded as "100" and "000" respectively, and the two binary codes indicate the numeral "40".

Similarly, the last column of the array can be encoded from top to bottom of the array as described above. As depicted in FIG. 6, the patterns in the last column are encoded as "011" and "001" respectively, and the two binary codes indicate the numeral "31".

Furthermore, the patterns in last row 63 can also be selectively expanded along the row direction of the array such that the adjacent patterns in last row 63 can be selectively connected, and the patterns in last row 63 are encoded to represent as binary notations according to connection relations of the adjacent patterns. Similarly, the pattern at the intersection of the last row and the third column is stretched out of the array to serve as an encoding separation. If two adjacent patterns in last column are connected then a binary digit "1" indicates the connection relation, while, if two adjacent patterns in last column are not connected then a binary digit "0" indicates the connection relation. Referring to FIG. 6 again, the patterns in the last row are encoded as "100" and "010" respectively, and the two binary codes indicate the numeral "42", according to the above principle. Such binary codes and their corresponding numerals can be used to represent the resolution data of the contact hole patterns such as length, width, and space, etc.

In the above embodiment, much useful information about the contact hole resolution can be easily obtained from the CD vernier pattern. Therefore, the present invention not only reduces the drawbacks of the prior art but also improves and simplifies the testing process.

The encoding methods for line CD vernier and contact hole CD vernier are carried out by way of examples. Those who wants to apply the present invention can select either the length difference or connection relation, or their combinations to carry out the encoding.

In view of the above mentioned, the CD vernier according to the present invention has the following advantages:

first, the possibility for misrecognition due to motion of the lens of SEM can be reduced;

second, the CD vernier is appropriate for automatic SEM measurement, resulting in high throughput; and third, the designs for the CD vernier are quite simple, and further contain more resolution data than the prior art.

Although the present invention has been described in terms of three specific embodiments, it is anticipated that alternations and modifications thereof will no doubt become apparent to those skilled in the art. It is therefore intended that the following claims be interpreted as covering all such alternations and modifications as fall within the true spirit and scope of the invention.

What is claimed is:

1. A critical dimension vernier apparatus for measuring the resolution of a line process, comprising:

a central strip pattern disposed along a specific direction;

a first plurality of strip patterns disposed in parallel, along said specific direction, and on a first side adjacent to said central strip pattern;

a second plurality of strip patterns disposed in parallel, along said specific direction, and on a second side adjacent to said central strip pattern;

a plurality of recognition patterns selectively added to said first plurality of strip patterns and to said second plurality of strip patterns;

wherein the number of strip patterns of the first plurality equals that of the number of strip patterns of the second plurality, each strip pattern having an equal length which is shorter than the length of said central strip pattern but is longer than the length of said recognition patterns, and wherein one end of said central strip pattern, one end of each strip pattern of the first plurality and one end of each strip pattern of the second plurality all being aligned on a base line, whereby said central strip pattern, said recognition patterns, said first plurality and said second plurality form a specific figure to serve as a critical dimension vernier pattern.

2. The critical dimension vernier apparatus as in claim 1, wherein said recognition patterns are selectively added to the other end of said strip patterns at said first side and second side, such that said strip patterns are binary encoded respectively according to whether one said recognition pattern is added to the other end of each said strip pattern.

3. The critical dimension vernier apparatus as in claim 1, wherein said recognition patterns are selectively added to any space between any two adjacent strip patterns close to said base line, such that said strip patterns are binary encoded respectively according to whether one said recognition pattern is added to the space between any two said strip patterns.

4. The critical dimension vernier apparatus as in claim 1, wherein the length of each one of said recognition patterns is 1.5–2 times that of the resolution of said critical dimension vernier apparatus.

5. A critical dimension vernier apparatus for measuring the resolution of a contact hole process, comprising:

a plurality of contact hole patterns arranged in a two dimensional array of rows and columns, the dimensions of said contact hole patterns in first and last rows of said array and said contact hole patterns in first and last columns of said array being selectively variable to serve as recognition patterns such that all said contact hole patterns can form a specific figure as a critical dimension vernier pattern.

6. The critical dimension vernier apparatus as in claim 5, wherein said contact hole patterns in said first and last rows are selectively stretched out of said array along a column direction of said rows such that said patterns in said first and last array have two different lengths, said patterns in said first and last rows being encoded respectively to represent binary notations.

7. The critical dimension vernier apparatus as in claim 5, wherein said patterns in said first and last columns are selectively extended from said array along a row direction of said array such that said patterns in said first and last columns have two different lengths, said patterns in said first and last columns being encoded respectively to represent binary notations.

8. The critical dimension vernier apparatus as in claim 5, wherein said patterns in said first and last rows are selectively expanded along a row direction of said array such that adjacent patterns in the same row can be selectively connected, said patterns in said first and second rows being encoded respectively to represent binary notations according to the connection relations of the adjacent patterns.

9. The critical dimension vernier apparatus as in claim 5, wherein said patterns in said first and last columns are selectively expanded along a column direction of said array such that adjacent patterns in the same column can be selectively connected, said patterns in said first and second columns being encoded respectively to represent binary notations according to the connection relations of the adjacent patterns.

\* \* \* \* \*